United States Patent [19]
Chan et al.

[11] Patent Number: 6,028,007
[45] Date of Patent: Feb. 22, 2000

[54] LOW COST HERMETIC SEALED MICROWAVE MODULE PACKAGING

[75] Inventors: Steven S. Chan, Alhambra; John E. Dowsing, III, Redondo Beach; Jason E. Snodgress, Playa Del Rey, all of Calif.

[73] Assignee: TRW Inc., Redondo Beach, Calif.

[21] Appl. No.: 09/274,832

[22] Filed: Mar. 23, 1999

Related U.S. Application Data

[62] Division of application No. 08/971,155, Nov. 14, 1997, Pat. No. 5,956,840.

[51] Int. Cl.$^7$ .................................................. H01L 21/311
[52] U.S. Cl. ........................... 438/694; 438/695; 438/696
[58] Field of Search ..................................... 438/694, 695, 438/696

[56] References Cited

U.S. PATENT DOCUMENTS

| | | | |
|---|---|---|---|
| 4,650,108 | 3/1987 | Gallagher | 228/124.1 |
| 4,676,817 | 6/1987 | Tailor et al. | 65/43 |
| 4,922,323 | 5/1990 | Potter | 174/251 |
| 4,953,001 | 8/1990 | Kaiser, Jr. et al. | 257/664 |
| 5,041,943 | 8/1991 | Ilardi et al. | 361/720 |
| 5,433,260 | 7/1995 | Taylor | 164/97 |

Primary Examiner—Robert Kunemund
Assistant Examiner—Vanessa Perez-Ramos
Attorney, Agent, or Firm—Michael S. Yatsko

[57] ABSTRACT

The invention relates to a method for producing low cost hermetic Integrated Module Assembly (IMA) packaging, where an aluminum coating (24) is deposited on a polytetrafluoral-ethaline substrate (20), the aluminum coating (24) is selectively etched to form a waveguide window (26) and the substrate (20) is selectively treated over the waveguide window (26) to produce a non-conductive hermetic seal. The substrate (20) is then joined to a metal carrier (28) containing the waveguide (30). As a result of using selectively treated low cost substrates to produce hermetic seals, more expensive substrates are not required to form hermetic seals over substrate to waveguide interconnections.

9 Claims, 2 Drawing Sheets

LOW COST HERMETIC SEALED MICROWAVE MODULE PACKAGING

This application is a divisional of application Ser. No. 08/971,155 filed on Nov. 14, 1997, now U.S. Pat. No. 5,956,840.

BACKGROUND OF THE INVENTION

1. Field of the Invention

The present invention relates to a method for producing low cost Integrated Module Assembly (IMA) packages, and, more specifically, to a method for producing hermetic microwave integrated circuit (MIC) packages, wherein a waveguide window is formed on a surface of a non-hermetic substrate through the deposition and selective treatment of a metallic layer to produce a non-conductive hermetic protective layer between a waveguide and the Integrated Module Assembly circuitry.

2. Description of the Prior Art

Methods for producing Integrated Module Assembly (IMA) packages are generally known in the art. Typically, IMA package circuitry includes active devices which can include discrete transistors, capacitors, and monolithically microwave integrated circuits. The active devices on IMA substrates require protection from ambient moisture and other corrosives. Hermetic seals are typically required to achieve the desired protection over the large temperature ranges to which the hosts of many IMA packages are subjected. In addition, these hermetic seals may require non-electrically conductive properties if the seals are used for microwave or similar applications.

Presently, Integrated Module Assembly packages use substrates made of ceramic or similar inorganic materials to form hermetic seals over IMA substrate to waveguide interconnections. For example, when a microwave signal is transferred from the circuitry on an IMA substrate to a waveguide interconnection, ceramic substrates are used to cover the transition to the waveguide to protect the IMA circuitry from moisture. Further, because the ceramic substrate is non-electrically conductive, signals passing through the waveguide are not deflected.

Various methods are known for the use of metallic layers or films as a means for providing hermetic seals in IMA packages. An example of such a package is disclosed in U.S. Pat. No. 4,650,108. As illustrated in the '108 patent, a hermetic seal is formed by adhering a metal film to a surface of a substrate.

Additionally, in a context unrelated to the proposed invention, U.S. Pat. No. 4,922,323 discloses the treatment of metallic layers to form non-electrically conductive metallic layers which provide supports around electrical feedthrus.

The methods disclosed in the '323 and '108 patents do not attempt, however, to disclose methods for hermetic seals formed of electrically non-conductive metallic material to provide a moisture free environment for circuitry located on a substrate.

Finally, while inorganic substrates like ceramic have been successful at providing hermetic protection of delicate circuitry from moisture and other corrosives, ceramic and like substrates are expensive, more difficult to fabricate and tend to be heavier than other substrate materials. For these reasons, a substrate is needed which maintains the hermeticity of substrates like ceramic, is lighter, less expensive and can be formed to provide non-electrically conductive characteristics for use as hermetic seals in microwave integrated circuit applications.

SUMMARY OF THE INVENTION

Briefly, the present invention relates to methods for producing low cost hermetic packaging for monolithic microwave integrated circuits using non-hermetic substrates. The non-hermetic substrates are coated with a metallic substance over an area of the substrate and the metallic layer is further selectively processed to render the metallic layer non-conductive. The ability to form hermetic seals from non-hermetic substrates results in a significant cost savings for hermetic monolithic microwave integrated circuit packaging because more expensive hermetic substrates are no longer required. In addition, because these less expensive hermetic seals can further be treated to remove any electrically conductive properties, the less expensive seals can be used for microwave or similar applications.

It is an aspect of the present invention to provide a method for producing hermetic packaging. The method comprises the steps of providing a metallized surface on a side of a substrate; selectively etching an area from the surface of the side of the substrate to produce an etched window; coating a thin layer of metallic material over the entire surface of the side of the substrate; selectively etching the metallic material from the surface of the substrate, except in the area of the etched window, to produce a waveguide window; selectively treating the remaining metallic material of the waveguide window to render the metallic material non-conductive; and finally, joining the substrate to a metal carrier containing a waveguide by sealing the surface of the substrate to the metal carrier.

Another aspect of the present invention is to provide an additional embodiment of a method for producing hermetic packaging. The method comprises the steps of providing a metallized surface on a side of a substrate; selectively treating an area of the metallized surface of the side of the substrate to render the area non-conductive to produce a waveguide window of the non-conductive metallized area; and finally, joining the substrate to a metal carrier containing a waveguide by sealing the surface of the substrate to the metal carrier.

BRIEF DESCRIPTION OF THE DRAWINGS

Reference is now made to the following specification and attached drawings, wherein.

DETAILED DESCRIPTION OF THE INVENTION

Figure 1A:
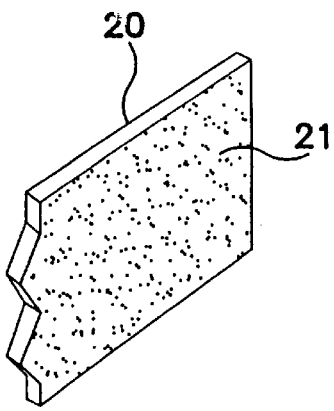
FIGS. 1a–1e are illustrations of the substrate preparation steps used for producing low cost hermetically sealed microwave module packaging in accordance with the present invention.

As previously mentioned, the present invention relates to an improvement in the hermetic packaging of microwave integrated circuits, and, more specifically, to coating a substrate with a metallic substance and to selectively treating the metallic coating over a waveguide window to produce a non-conducting protective hermetic seal. Forming a metallic and non-conductive seal of the waveguide window of a substrate affords the same hermeticity as other materials typically used to seal waveguide openings with the additional advantages of lower material cost and less overall weight.

It should be understood by those of ordinary skill in the art that the principles of the present invention are applicable to many types of integrated module packages, such as those related to antenna applications, cellular (wireless) communication applications, and optical applications. The principles of the present invention are also applicable to many types of low cost substrate compositions, such as polymer, poly-tetrafluoral-ethaline (ptfe), and polyimide. For illustration, the invention is described and illustrated further in FIGS. 1a through 1e with a substrate 20, metallized surface 21, etched window 22, metallic coating 24, and waveguide window 26. The invention is further described and illustrated in FIG. 2 with the substrate 20, and the waveguide window 26 from FIG. 1d, in addition to a solid metal base carrier 28, and a waveguide 30.

Figure 1B:
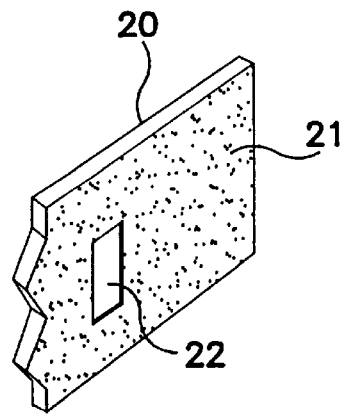

More specifically, and with reference to the drawings, the first steps of the packaging process, as illustrated in FIGS. 1a through 1e, relate to the preparation of the pre-metallized poly-tetrafluoral-ethaline substrate 20. First, as illustrated in FIGS. 1a and 1b, an etched window 22 is formed on a metallized surface 21 of the substrate 20 by etching an area equal to or slightly smaller than the size of the waveguide opening 30 of FIG. 2. The etched window 22 is formed by etching the substrate 20 in a sodium hydroxide solution. The etched window 22 is formed to remove the metallized surface 21, since pre-metallized substrates are typically metallized with materials that cannot later be treated to produce dielectric properties. For the purposes of the illustrated embodiment, poly-tetrafluoral-ethaline is chosen as the substrate material. It is important to note that other low cost substrate materials can be used, for example, polymer and polyimide. Additionally, the preferred embodiment illustrates a pre-metallized substrate, but does not require pre-metallization. It is only important that the metallized surface 21 be suitable for joining to metal surfaces and optionally compatible with treatments which render metallic materials non-conductive.

Figure 1C:
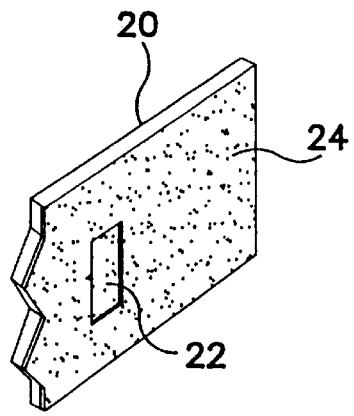

Next, as illustrated in FIG 1c, a very thin layer (preferably less than one mil) of metallic coating 24 is deposited over the entire surface of the substrate 20 such as by a sputtering process. Aluminum is the preferred metallic coating 24, chosen for its dielectric properties after anodization and high sputter deposition rate.

Figure 1D:
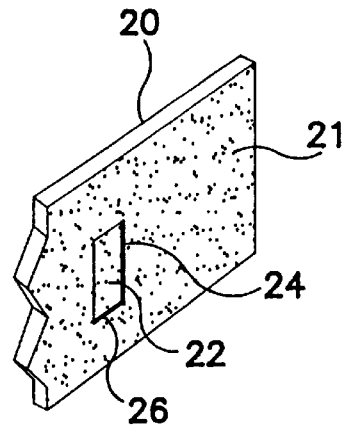
Figure 2:
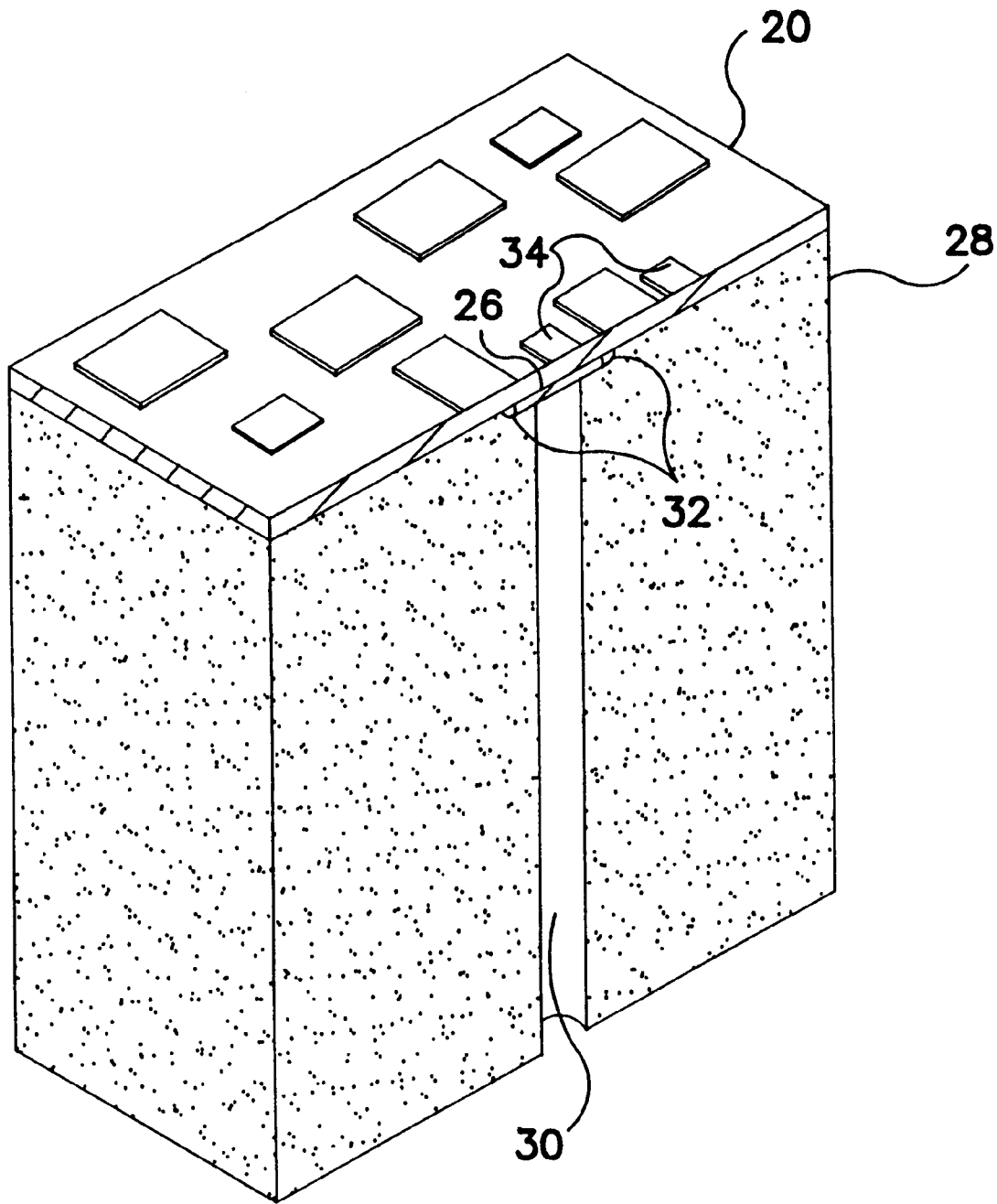
FIG. 2 is a cross-sectional view of a microwave module package assembly containing the substrate of FIG. 1 and a solid metal carrier with a waveguide opening in accordance with the present invention.

As shown is FIG. 1d, the metallic coating 24 is selectively etched from the surface of the substrate 20 to produce a waveguide window 26 of the remaining metallic coating 24 where the size of the waveguide window 26 is slightly larger than or equal to the waveguide opening 30 illustrated in FIG. 2. This is done by masking the area of the waveguide window 26 and removing the metallic coating 24 surrounding the waveguide window 26 in a sodium hydroxide etch solution. This selective etching process exposes the metallized surface 21 which is later used to join the substrate 20 to the metal base carrier 28. As previously mentioned, the metallized surface 21 is important for its suitability for joining to metal surfaces during processes like soldering and brazing. Further, because the aluminum metallic coating 24 is not best suited for joining to metal surfaces, the metallic coating 24 is removed in the area surrounding the waveguide window 26 and the metallized surface 21 exposed.

Figure 1E:
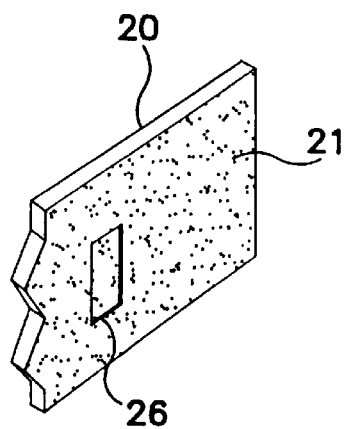

As shown is FIG. 1e, the substrate 20 is selectively anodized over the waveguide window 26 forming a non-conductive hermetic protective layer. Anodizing can be accomplished using a chromic or a sulfuric acid solution to produce a coating thickness of from 0.0002 to 0.001 inches. However, for the purposes of the illustrated embodiment, 0.0006 is chosen as the preferred coating thickness. It is important to note than the very thin anodized layer will not disturb the electric field transmitted to any receiving probe on the substrate 20.

Finally, as shown in FIG. 2, the substrate 20 is joined to a metal carrier 28 containing a waveguide 30 by positioning the anodized waveguide window 26 over the waveguide opening 30 and the substrate 20 is hermetically sealed to the metal base carrier 28 by soldering or brazing 32 the metallized surface 21 of the substrate 20 to a surface of the metal base carrier 28. As previously mentioned, and further illustrated in FIG. 2, the waveguide window 26 forms a non-conductive protective layer between the waveguide 30 and any integrated module packaging circuitry 34 of the substrate 20. Signals can be transmitted or received through the waveguide 30, and, as a result of the hermetic seal formed from the waveguide window 26, the circuitry 34 of the substrate 20 is protected from exposure to moisture and other environmental elements that may be introduced as a result of the waveguide opening 30.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for producing hermetic packaging, said method comprising the steps of:

providing a metallized surface on a side of a substrate;

selectively treating an area of the metallized surface of the side of the substrate to render the area non-conductive to produce a waveguide window of the non-conductive metallized area; and after the treating step, joining the substrate to a metal carrier containing a waveguide by sealing the surface of the substrate to a metal carrier.

2. The method as recited in claim 1, wherein the step of providing the metallized surface on the side of the substrate further comprises the step of providing the substrate of polymer.

3. The method as recited in claim 1, wherein the step of providing the metallized surface on the side of the substrate further comprises the step of providing the substrate of poly-tetrafluoral-ethaline.

4. The method as recited in claim 1, wherein the step of providing the metallized surface on the side of the substrate further comprises the step of providing the substrate of polyimide.

5. The method as recited in claim 1, wherein the step of selectively treating the area of the metallized surface of the substrate to produce a waveguide window further comprises the step of anodizing the metallized surface of the waveguide window.

6. The method as recited in claim 1, wherein the step of selectively treating the area of the metallized surface of the substrate to produce a waveguide window further comprises the step of anodizing the metallized surface of the waveguide window with chromic acid.

7. The method as recited in claim 1, wherein the step of selectively treating the area of the metallized surface of the substrate to produce a waveguide window further comprises the step of anodizing the metallized surface of the waveguide window with chromic acid to a thickness of from 0.0002 to 0.001 inches.

8. The method as recited in claim 1, wherein the step of selectively treating the area of the metallized surface of the substrate to produce a waveguide window further comprises the step of anodizing the metallized surface of the waveguide window with sulfuric acid.

9. The method as recited in claim 1, wherein the step of selectively treating the area of the metallized surface of the substrate to produce a waveguide window further comprises the step of anodizing the metallized surface of the waveguide window with sulfuric acid to a thickness of from 0.0002 to 0.001 inches.

\* \* \* \* \*